(12) United States Patent
Uchida et al.

(10) Patent No.: US 9,748,316 B2
(45) Date of Patent: Aug. 29, 2017

(54) ORGANIC ELECTROLUMINESCENT PANEL

(71) Applicant: Sharp Kabushiki Kaisha, Osaka-shi, Osaka (JP)

(72) Inventors: Hideki Uchida, Osaka (JP); Yuto Tsukamoto, Osaka (JP); Katsuhiro Kikuchi, Osaka (JP); Manabu Niboshi, Osaka (JP); Yoshiyuki Isomura, Osaka (JP); Ayataka Endo, Osaka (JP); Asae Ito, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/032,381

(22) PCT Filed: Oct. 24, 2014

(86) PCT No.: PCT/JP2014/078314
§ 371 (c)(1),
(2) Date: Apr. 27, 2016

(87) PCT Pub. No.: WO2015/064491
PCT Pub. Date: May 7, 2015

(65) Prior Publication Data
US 2016/0254330 A1   Sep. 1, 2016

(30) Foreign Application Priority Data

Oct. 28, 2013   (JP) ................ 2013-223601

(51) Int. Cl.
*H01L 29/08*   (2006.01)
*H01L 27/14*   (2006.01)
(Continued)

(52) U.S. Cl.
CPC ...... *H01L 27/3244* (2013.01); *H01L 51/5004* (2013.01); *H01L 51/5024* (2013.01);
(Continued)

(58) Field of Classification Search
CPC ............ H01L 27/3244; H01L 51/5004; H01L 51/5024; H01L 51/5056; H01L 51/5068;
(Continued)

(56) References Cited

U.S. PATENT DOCUMENTS

2005/0072977 A1   4/2005 Saito et al.
2005/0084713 A1   4/2005 Kido et al.
(Continued)

FOREIGN PATENT DOCUMENTS

JP   2004-296410 A   10/2004
JP   2005-032618 A   2/2005
(Continued)

OTHER PUBLICATIONS

Official Communication issued in International Patent Application No. PCT/JP2014/078314, dated Jan. 6, 2015.

*Primary Examiner* — Dzung Tran
(74) *Attorney, Agent, or Firm* — Keating & Bennett, LLP

(57) ABSTRACT

The present invention provides an organic electroluminescent panel capable of increasing the luminous efficacy and decreasing the driving voltage of a top emission (TE) organic EL element. The organic electroluminescent panel of the present invention includes: a substrate; and an organic electroluminescent element provided on the substrate. The organic electroluminescent element is a top emission element that includes, in the order from the substrate side: an anode; a light-emitting layer; an electron transport layer; a first metal layer; a p-type oxide layer; and a transparent cathode. The top emission element is configured to emit light from the transparent cathode side. The light-emitting layer and the electron transport layer are each formed from an organic material. At least one of a mixture layer of a (Continued)

p-type oxide and a hole transport material and a second metal layer is provided between the electron transport layer and the transparent cathode.

13 Claims, 5 Drawing Sheets

(51) Int. Cl.
 B32B 9/00 (2006.01)
 H01L 27/32 (2006.01)
 H01L 51/50 (2006.01)
 H01L 51/52 (2006.01)
 H01L 51/00 (2006.01)

(52) U.S. Cl.
 CPC ...... *H01L 51/5056* (2013.01); *H01L 51/5068* (2013.01); *H01L 51/5072* (2013.01); *H01L 51/5088* (2013.01); *H01L 51/5092* (2013.01); *H01L 51/5234* (2013.01); *H01L 51/006* (2013.01); *H01L 51/0058* (2013.01); *H01L 51/5278* (2013.01); *H01L 2251/301* (2013.01); *H01L 2251/303* (2013.01); *H01L 2251/308* (2013.01); *H01L 2251/5315* (2013.01); *H01L 2251/552* (2013.01)

(58) Field of Classification Search
 CPC ............. H01L 51/5072; H01L 51/5088; H01L 51/5092; H01L 51/5234; H01L 51/0058; H01L 51/006; H01L 51/5278; H01L 2251/301; H01L 2251/308; H01L 2251/5315; H01L 2251/552
 USPC ...................................... 257/40, 72; 428/690
 See application file for complete search history.

(56) References Cited

U.S. PATENT DOCUMENTS

| 2005/0098207 | A1* | 5/2005 | Matsumoto ......... H01L 51/0077 136/263 |
| 2006/0027830 | A1 | 2/2006 | Kumaki et al. |
| 2007/0182320 | A1 | 8/2007 | Nakamura |
| 2007/0200125 | A1* | 8/2007 | Ikeda ................... H01L 51/5088 257/94 |
| 2007/0241665 | A1 | 10/2007 | Sakanoue et al. |
| 2008/0203385 | A1 | 8/2008 | Saito et al. |
| 2008/0261075 | A1* | 10/2008 | Seo ..................... H01L 51/0038 428/690 |
| 2008/0272689 | A1* | 11/2008 | Ide ...................... H01L 51/5206 313/504 |
| 2008/0278064 | A1* | 11/2008 | Kumaki ............... H01L 51/5052 313/504 |
| 2009/0079342 | A1 | 3/2009 | Kumaki et al. |
| 2010/0052525 | A1 | 3/2010 | Oda et al. |
| 2011/0241007 | A1 | 10/2011 | Kumaki et al. |
| 2011/0260206 | A1 | 10/2011 | Saito et al. |
| 2015/0263307 | A1 | 9/2015 | Saito et al. |

FOREIGN PATENT DOCUMENTS

| JP | 2005-123094 A | 5/2005 |
| JP | 2007-214228 A | 8/2007 |
| JP | 2007-288071 A | 11/2007 |
| JP | 2009-076929 A | 4/2009 |
| JP | 2010-055926 A | 3/2010 |
| JP | 2012-119724 A | 6/2012 |
| JP | 2012-156529 A | 8/2012 |
| JP | 2012-234737 A | 11/2012 |
| JP | 2013-084413 A | 5/2013 |
| JP | 2013-084554 A | 5/2013 |

* cited by examiner

PRIOR ART

ORGANIC ELECTROLUMINESCENT PANEL

TECHNICAL FIELD

The present invention relates to organic electroluminescent panels (hereinafter, also referred to as "organic EL panels"). The present invention specifically relates to top emission organic EL panels.

BACKGROUND ART

Organic EL panels provided with an organic electroluminescent element (hereinafter, also referred to as an "organic EL element") utilizing the electroluminescence of an organic material currently receive attention. The organic EL element emits light by recombining holes injected from an anode and electrons injected from a cathode in a light-emitting layer provided between the electrodes. When used as display panels for thin profile display devices, the organic EL panels are superior to liquid crystal display devices in characteristics such as high contrast and low power consumption. The organic EL panels are also expected to be used in applications other than display devices, such as lighting.

The organic EL element includes, in the order from the substrate side, a lower electrode, an organic light-emitting layer, and an upper electrode. A structure in which the lower electrode is a transparent conductive film, the upper electrode is a metal layer, and the light is emitted from the lower electrode side is called a bottom emission (BE) structure. In contrast, a structure in which the lower electrode is a metal layer, the upper electrode is a transparent conductive film or a semi-transparent metal film, and the light is emitted from the upper electrode side is called a top emission (TE) structure. Another structure is proposed in which the lower electrode and the upper electrode are transparent or semi-transparent and the light is emitted from both sides.

Patent Literatures 1 to 9 disclose various stack structures of the top-emission-structured organic EL element, for example.

CITATION LIST

Patent Literature

Patent Literature 1: JP 2005-123094 A
Patent Literature 2: JP 2009-76929 A
Patent Literature 3: JP 2004-296410 A
Patent Literature 4: JP 2005-32618 A
Patent Literature 5: JP 2007-214228 A
Patent Literature 6: JP 2012-119724 A
Patent Literature 7: JP 2013-84554 A
Patent Literature 8: JP 2013-84413 A
Patent Literature 9: JP 2012-156529 A

SUMMARY OF INVENTION

Technical Problem

FIG. 8 is a schematic cross-sectional view of a conventionally usual top-emission-structured organic EL panel. An organic EL panel R illustrated in FIG. 8 includes an organic EL element 8 provided on a substrate 111. The organic EL element has a structure including, in the order from the substrate 111 side, an anode 112, a hole injection layer, a hole transport layer, a light-emitting layer, an electron transport layer, an electron injection layer, and a cathode 113. One layer may also possess the function of an adjacent layer.

When an electric charge is injected into and transported through the organic layers, the highest occupied molecular orbital (HOMO) level is used for the holes and the lowest unoccupied molecular orbital (LUMO) level is used for the electrons. Injection of an electric charge from an electrode is performed between the work function (WF) of the electrode and the HOMO or LUMO level of the corresponding organic layer. If the difference between the energy levels is large, this difference serves as a barrier for injection and causes an increase in the driving voltage. Thus, the electrode in contact with the hole injection layer is preferably a p-type electrode whose work function is close to the LUMO level, whereas the electrode in contact with the electron injection layer is preferably an n-type electrode whose work function is close to the LUMO level.

The cathode (upper electrode) 113 used in such a top-emission-structured organic EL element is a transparent conductive film, a semi-transparent metal film, or a laminate of a semi-transparent metal film and a transparent conductive film, for example. This causes the following problems (1) and (2).

(1) Electron Injectability

Materials (e.g., ITO, IZO) for a transparent conductive film (transparent cathode) used as an upper electrode has a large absolute value of the work function (about −5 eV). Thus, there is a large gap between the work function and the LUMO level of an electron transportable organic material used for an electron injection layer (EIL) and an electron transport layer (ETL), so that electrons are not efficiently injected.

(2) Damage on Transparent Conductive Film During Formation

A semi-transparent metal film is thin so as to secure the transparency, but it may fail to secure the conductivity. If a transparent conductive film is stacked on a semi-transparent metal film so as to secure the conductivity, organic layers are damaged during formation of the transparent conductive film and the luminous efficacy is markedly deteriorated. For example, an ITO or IZO film is formed by flat plate sputtering, ion plating, electron beam (EB) evaporation, ion beam sputtering, or the like. These methods are performed in a vacuum, and the methods other than EB evaporation improve the transparency and conductivity of the transparent conductive film by slightly injecting oxygen during the film formation. In any method, secondary electrons, plasma, and the like are emitted during the formation. Such events cause significant damages on the organic layers that have been formed, and the functions of the respective layers are deteriorated.

The present invention is devised in view of the above situation, and aims to provide an organic EL panel capable of increasing the luminous efficacy and decreasing the driving voltage of a top emission organic EL element.

Solution to Problem

The present inventors have performed various studies on an optimal stack structure of the top emission organic EL element, and thereby found that a stack structure that sequentially includes an electron transport layer, a first metal layer, a p-type oxide layer, and a transparent cathode and which is additionally provided with at least one of a mixture layer of a p-type oxide and a hole transport material and a second metal layer between the electron transport layer and the transparent cathode is capable of increasing the luminous efficacy and decreasing the driving voltage. As a result, the present inventors have arrived at the solution of the above problems and completed the present invention.

Specifically, one aspect of the present invention may be an organic electroluminescent panel including: a substrate; and an organic electroluminescent element provided on the substrate, the organic electroluminescent element being a top emission element that includes, in the order from the substrate side: an anode; a light-emitting layer; an electron transport layer; a first metal layer; a p-type oxide layer; and a transparent cathode, the top emission element being configured to emit light from the transparent cathode side, the light-emitting layer and the electron transport layer each being formed from an organic material, at least one of a mixture layer of a p-type oxide and a hole transport material and a second metal layer being provided between the electron transport layer and the transparent cathode.

Advantageous Effects of Invention

The organic EL panel of the present invention is capable of increasing the luminous efficacy and decreasing the driving voltage of a top emission organic EL element.

DESCRIPTION OF EMBODIMENTS

Figure 1:
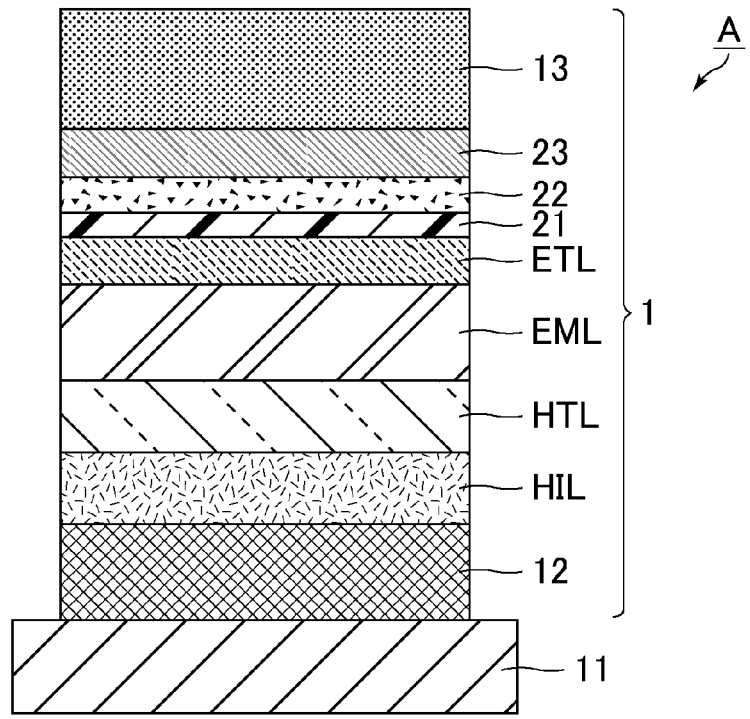
FIG. 1 is a schematic cross-sectional view of an organic EL panel of Example 1.

The organic electroluminescence herein is also expressed as "organic EL". The organic EL element is an element that is also called as an organic light emitting diode (OLED).

The organic EL element of the present embodiment is a top emission (TE) element. Thus, the upper electrode is a transparent cathode. The top emission and the top emission structure herein have only to mean a structure that is configured to emit light from the upper electrode side, and include a structure that is configured to emit light from both the lower electrode side and the upper electrode side.

If layers (hereinafter, also referred to as "organic layers") that are formed from organic materials before the formation of a transparent cathode, such as a light-emitting layer and an electron transport layer, are directly exposed to the environment of forming a transparent conductive film constituting the transparent cathode, the layers of organic materials are damaged. Examples of such damages include, in terms of phenomena, oxidation in an organic layer so that the layer is insulated, and in terms of characteristics, a great increase in the driving voltage and a decrease in the current efficiency in the organic EL element. If an organic layer is heavily damaged, the organic EL element emits no light.

In order to prevent such damages on the organic layers, a layer for protecting the organic layers is required. Thus, the present inventors have performed studies to find that various advantages can be achieved by providing a stack structure of electron transport layer/first metal layer/p-type oxide layer/transparent cathode for a top-emission-structured organic EL element.

A first advantage of the stack structure is that damages on the electron transport layer and the layers below the electron transport layer can be prevented by mainly utilizing the p-type oxide layer. The p-type oxide layer can maintain the transparency thereof even if the layer is about 10 to 20 nm thick, and thus can effectively prevent damages on the electron transport layer and the organic layers below the electron transport layer during formation of the transparent cathode (e.g., ITO).

A second advantage of the stack structure is that electrons can be efficiently injected from the transparent cathode to the electron transport layer. The first metal layer, the p-type oxide layer, and the transparent cathode are conductive layers having electric charges in themselves. Thus, the respective interfaces are ohmic contact interfaces and can transport the electric charges regardless of the difference between the work functions. Specifically, the p-type oxide layer has, as a charge generating layer, a function of transporting electrons to the electron transport layer side and holes to the transparent cathode side. Thus, in the case of injecting electrons from the transparent cathode to the electron transport layer, only a barrier of the first metal layer adjacent to the electron transport layer needs to be considered. When the absolute value of the work function of the first metal layer adjacent to the electron transport layer is equal to or lower than the LUMO level of the electron transport layer, electrons can be injected without an increase in voltage due to the barrier. The p-type oxide layer itself has an electric charge, and thus can inject an electric charge to the electron transport layer even if the surface thereof is damaged by formation of the transparent cathode.

As mentioned above, the studies performed by the present inventors prove that the stack structure is suitable in that damages on the organic layers can be prevented during formation of the transparent cathode and an element having a small barrier for injection and a low driving voltage can be achieved in a top-emission-structured organic EL element. In order to achieve a driving voltage equal to the driving voltage of a bottom emission type having the same configuration, further improvement for decreasing the driving voltage is still required.

In order to achieve this improvement, the present inventors have found that damages during formation of the transparent cathode can be more securely prevented and the driving voltage can be further decreased while the transparency and the ohmic contact are maintained by additionally providing at least one of a mixture layer of a p-type oxide and a hole transport material and a second metal layer between the electron transport layer and the transparent cathode.

The aforementioned configuration of the stack structure of electron transport layer/first metal layer/p-type oxide layer/transparent cathode additionally provided with at least one of a mixture layer of a p-type oxide and a hole transport material and a second metal layer between the electron transport layer and the transparent cathode is a novel configuration that is not disclosed in the Patent Literatures 1 to 9.

The present invention will be mentioned in more detail referring to the drawings in the following examples, but is not limited to these examples. The configurations of the examples may be appropriately combined or modified within the spirit of the present invention.

Example 1

Example 1 relates to a configuration including a second metal layer between the p-type oxide layer and the transparent cathode.

FIG. 1 is a schematic cross-sectional view of an organic EL panel of Example 1. In an organic EL panel A illustrated in FIG. 1, an organic EL element 1 provided on a substrate 11 includes, in the order from the substrate 11 side, an anode 12, a hole injection layer HIL, a hole transport layer HTL, a light-emitting layer EML, an electron transport layer ETL, a first metal layer 21, a p-type oxide layer 22, a second metal layer 23, and a transparent cathode 13.

The substrate 11 may be a glass substrate or a plastic substrate, for example. If the substrate 11 is a bendable plastic substrate, a flexible organic EL panel is obtained. Although not illustrated in FIG. 1, the substrate 11 is provided with a thin film transistor. The driving of the organic EL element 1 is controlled by electrically connecting the thin film transistor to the anode 12.

In the organic EL panel A of the present example, the anode 12 has light reflectivity and the transparent cathode 13 has light transmissivity. In other words, the organic EL element 1 of the present example is a top emission element that is configured to emit light from the transparent cathode 13 side.

The anode 12 was a laminate (hereinafter, also referred to as "Al/IZO") of an aluminum (Al) layer and an indium zinc oxide (IZO) layer stacked in the order from the substrate 11 side. The anode 12 may be an electrode having light reflectivity. In place of the above laminate, an Al layer or an indium (In) layer may be used, for example. The anode 12 was 50 nm thick.

The hole injection layer HIL was a layer (p-doped layer) formed by co-deposition of 4,4'-bis[N-(1-naphthyl)-N-phenyl-amino]-biphenyl (α-NPD) and molybdenum trioxide (MoO3) at a weight ratio of 80:20. The material of the hole injection layer HIL may be the same organic HIL material as used in usual organic EL elements. In place of the above layer, a layer formed by co-deposition of an organic HTL material other than α-NPD and $MoO_3$ at a weight ratio of 80:20 may be used, for example. The hole injection layer HIL was 40 nm thick.

The material of the hole transport layer HTL was α-NPD. The material of the hole transport layer HTL may be the same organic HTL material as used in usual organic EL elements. The hole transport layer HTL was 30 nm thick.

The light-emitting layer EML was a film formed by ternary deposition of a host material (70% by weight), an assist material (25% by weight), and a dopant (5% by weight). The light-emitting layer EML was 60 nm thick. The luminescent color is red. The material of the light-emitting layer EML may be the same organic EML material as used in usual organic EL elements.

The material of the electron transport layer ETL was bathophenanthroline (Bphen). The material of the electron transport layer ETL may be the same organic ETL material as used in usual organic EL elements. The electron transport layer ETL was 15 nm thick.

The first metal layer 21 was a lithium (Li) layer. The Li layer was formed by deposition using an alkali dispenser.

The material of the first metal layer 21 may be any metal. The first metal layer 21 formed of a metal can be ohmically connected to the p-type oxide layer 22. In order to efficiently inject electrons to the electron transport layer ETL, the first metal layer 21 is preferably formed of a metal whose absolute value of the work function is smaller than the absolute value of the LUMO energy of the electron transport layer ETL. The metal used for the first metal layer 21 is appropriately selected in accordance with the material of the electron transport layer ETL, and examples of suitable metals other than Li include cesium (Cs), barium (Ba), and calcium (Ca). Any of these metals may be used in place of Li.

The first metal layer 21 was 1 nm thick. The first metal layer 21 may have any thickness, and is preferably 0.5 to 5 nm thick. If the thickness is smaller than 0.5 nm, the first metal layer 21 may fail to sufficiently provide the function thereof. If the thickness exceeds 5 nm, the film may be less stable and the process of film formation may be less easily controlled.

The p-type oxide layer 22 was a molybdenum trioxide ($MoO_3$) layer. The $MoO_3$ layer was formed by vapor deposition. The material of the p-type oxide layer 22 may be vanadium(V) oxide ($V_2O_5$), for example, in place of the above material.

The p-type oxide layer 22 serves as a charge generating layer, and can be ohmically connected to the first metal layer 21 and the second metal layer 23. The p-type oxide layer 22 has a lower activity than alkali metals and alkaline-earth metals used for improving the efficiency of electron injection in Patent Literature 3 (JP 2004-296140 A), and is hardly damaged during formation of the transparent cathode 13. Thus, formation of the p-type oxide layer 22 leads to improvement of the electron injection ability from the transparent cathode 13 to the electron transport layer ETL.

The p-type oxide layer 22 was 5 nm thick. The p-type oxide layer 22 may have any thickness, and is preferably 0.5 to 20 nm thick. If the thickness is smaller than 0.5 nm, the p-type oxide layer 22 may fail to sufficiently provide the function thereof. If the thickness exceeds 20 nm, the transmitted light may be colored or the transmittance may be insufficient.

The second metal layer 23 was an aluminum (Al) layer. The material of the second metal layer 23 may be any metal, and is preferably a metal that is less likely to be oxidized after the formation. Examples of such a metal other than Al include silver (Ag) and gold (Au). For the first metal layer 21, the material thereof is preferably a metal whose absolute value of the work function is smaller than the absolute value of the LUMO energy of the electron transport layer ETL in order to efficiently inject electrons to the electron transport layer ETL. In contrast, the material of the second metal layer 23 is usually preferably a metal whose absolute value of the work function is greater than that of the material of the first metal layer 21 in order to achieve good reactivity.

The second metal layer 23 serves as a protecting layer during the process of forming the transparent cathode 13, and can remove damages on the layers below the second metal layer 23. Since the p-type oxide layer 22 is as thin as 5 nm, formation of the second metal layer 23 can more sufficiently remove damages on the layers below the second metal layer 23. Further, the second metal layer 23 can be ohmically connected to the p-type oxide layer 22 and the transparent cathode 13. Formation of the second metal layer 23 instead of thickening the p-type oxide layer 22 leads to a low resistance value. Formation of the second metal layer 23 also more effectively leads to an effect of micro-cavities.

The second metal layer 23 was 1 nm thick. The second metal layer 23 may have any thickness, and is preferably 1 to 20 nm thick. A thin second metal layer 23 is advantageous for easily transmitting light, whereas it is disadvantageous for preventing damages on the layers therebelow during the process of forming the transparent cathode 13, for reinforcing the effect of micro-cavities (increasing the reflectance), and for reducing the interconnect resistance. If the interconnect resistance is high and the area of the organic EL panel A is large, a voltage drop of a pixel may occur.

The transparent cathode 13 was an indium tin oxide (ITO) layer. The ITO layer was formed by sputtering deposition. The material of the transparent cathode 13 may be an electrode having light transmissivity. For example, IZO may be used in place of the aforementioned one. In order to provide a top emission structure, the transparent cathode 13 is required. The transparent cathode 13 was 100 nm thick.

Figure 2:
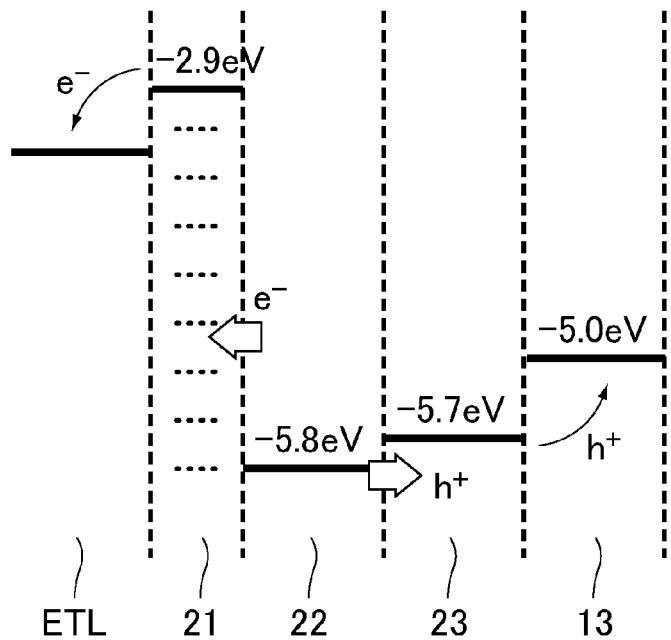
FIG. 2 is a correlation diagram of bands on the cathode side of the organic EL panel of Example 1.

In the present example, the Li layer (first metal layer 21) is formed on the electron transport layer ETL, the metal oxide $MoO_3$ layer (p-type oxide layer 22) is formed thereon, and the Al layer (second metal layer 23) and the ITO layer (transparent cathode 13) are formed thereon. Li, $MoO_3$, Al, and ITO are conductive materials having electric charges in themselves. Thus, they are ohmically connected to each other and can smoothly transfer the electric charges. The transfer of these electric charges is described with reference to FIG. 2. FIG. 2 is a correlation diagram of bands on the cathode side of the organic EL panel of Example 1. As illustrated in FIG. 2, the p-type oxide layer 22 ($MoO_3$, work function: −5.8 eV) serves as a charge generating layer. When a hole is injected from the transparent cathode 13 (ITO, work function: −5.0 eV) through the second metal layer 23 (Al, work function: −5.7 eV), an electron can be injected to the first metal layer 21 (Li, work function: −2.9 eV). As mentioned here, electric charges can be smoothly transported from the transparent cathode (ITO) 13 to the first metal layer 21(Li). The LUMO level of the material constituting the electron transport layer ETL is −3.05 eV and is lower than the work function (−2.9 eV) of the first metal layer 21 (Li). Thus, the electron is injected from the first metal layer 21 (Li) to the electron transport layer ETL without any barrier.

The light-emitting layer EML and the electron transport layer ETL are each formed from an organic material. In contrast, Li constituting the first metal layer 21 is a metal, $MoO_3$ constituting the p-type oxide layer 22 is an inorganic oxide, and Al constituting the second metal layer 23 is a metal. Thus, the stack structure of the first metal layer 21, the p-type oxide layer 22, and the second metal layer 23 can sufficiently prevent damages during formation of the transparent cathode (ITO) 13 and electrons can be injected from the transparent cathode (ITO) 13 to the electron transport layer ETL side without any barrier.

In addition to the above constitutional elements, the organic EL element 1 of the present example may appropriately include a hole blocking layer and an electron blocking layer, or may include a layer having two or more functions, such as a hole injection and hole transport layer prepared by integrating a hole injection layer and a hole transport layer.

One modified example of Example 1 is a structure having the second metal layer between the first metal layer and the p-type oxide layer. In this modified example, the organic EL element provided on the substrate 11 includes, in the order from the substrate 11 side, the anode 12, the hole injection layer HIL, the hole transport layer HTL, the light-emitting layer EML, the electron transport layer ETL, the first metal layer 21, the second metal layer 23, the p-type oxide layer 22, and the transparent cathode 13.

Another modified example of Example 1 is a structure having the second metal layer between the electron transport layer and the first metal layer. In this modified example, the organic EL element provided on the substrate 11 includes, in the order from the substrate 11 side, the anode 12, the hole injection layer HIL, the hole transport layer HTL, the light-emitting layer EML, the electron transport layer ETL, the second metal layer 23, the first metal layer 21, the p-type oxide layer 22, and the transparent cathode 13.

Example 2

Example 2 relates to a configuration having the mixture layer between the p-type oxide layer and the transparent cathode. An organic EL panel of Example 2 has the same configuration as of Example 1 except that the second metal layer in the organic EL element is replaced by the mixture layer.

Figure 3:
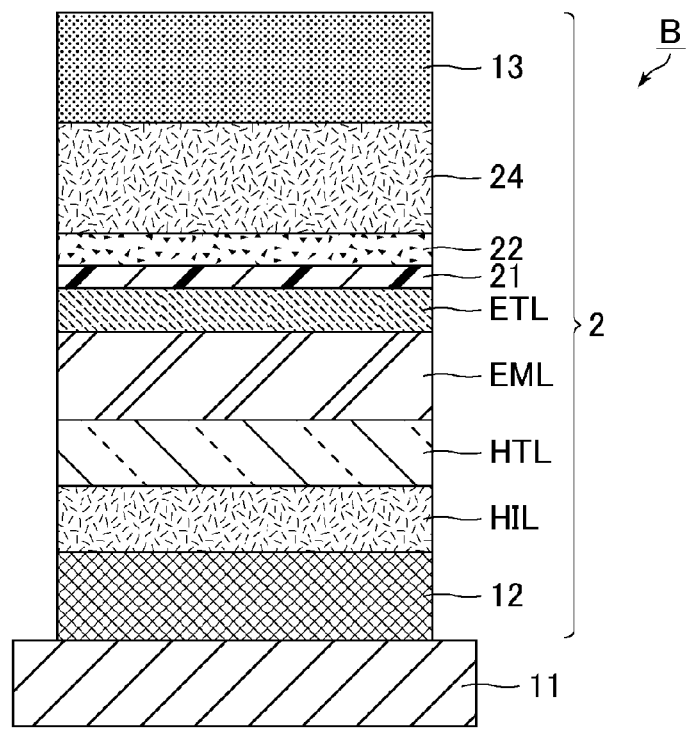
FIG. 3 is a schematic cross-sectional view of an organic EL panel of Example 2.

FIG. 3 is a schematic cross-sectional view of the organic EL panel of Example 2. In an organic EL panel B illustrated in FIG. 3, an organic EL element 2 provided on the substrate 11 includes, in the order from the substrate 11 side, the anode 12, the hole injection layer HIL, the hole transport layer HTL, the light-emitting layer EML, the electron transport layer ETL, the first metal layer 21, the p-type oxide layer 22, a mixture layer 24, and the transparent cathode 13.

The mixture layer 24 is formed from the same material as the hole injection layer HIL used in Example 1. In other words, the mixture layer 24 was a layer (p-doped layer) formed by co-deposition of α-NPD and molybdenum trioxide ($MoO_3$) at a weight ratio of 80:20. Since a charge transfer complex is formed by doping $MoO_3$, which is a p-type oxide, into α-NPD, the mixture layer 24 includes a sufficient number of electric charges therein. Thus, the interfaces among the transparent cathode (ITO) 13, the mixture layer 24, and the p-type oxide ($MoO_3$) layer 22 are ohmically connected with each other, and the electric charges are smoothly transferred.

The mixture layer 24 is an organic-inorganic hybrid material doped with a material ($MoO_3$) having a low activity. Thus, the layer is less damaged during formation of the transparent cathode (ITO) 13. If the p-type oxide layer 22 is thick, the layer may be colored (tinged), and if the thickness is several tens of nanometers, the layer may disadvantageously be black. Still, the mixture layer 24 can advantageously maintain the transparency even if the mixture layer is thick.

The amount of the p-type oxide ($MoO_3$) in the mixture layer 24 is preferably 10 to 50% by weight, more preferably 15 to 25% by weight.

The mixture layer 24 was 175 nm thick. Even if the mixture layer 24 is thickened to about 200 nm, the layer does not increase the driving voltage. This is due to an effect of the electric charges included in the layer by the doping. Further, as mentioned above, the mixture layer 24 can maintain the transparency even if it is thick. As mentioned above, the mixture layer 24, even if thickened, prevents an increase in the driving voltage, and maintains the transparency, and forming such a film that enables electrically conductive injection with adjacent layers without any barrier, on the first metal layer 21 and the organic layers such as the light-emitting layer EML and the electron transport layer ETL, enables significant removal of damages during formation of the ITO film.

Figure 4:
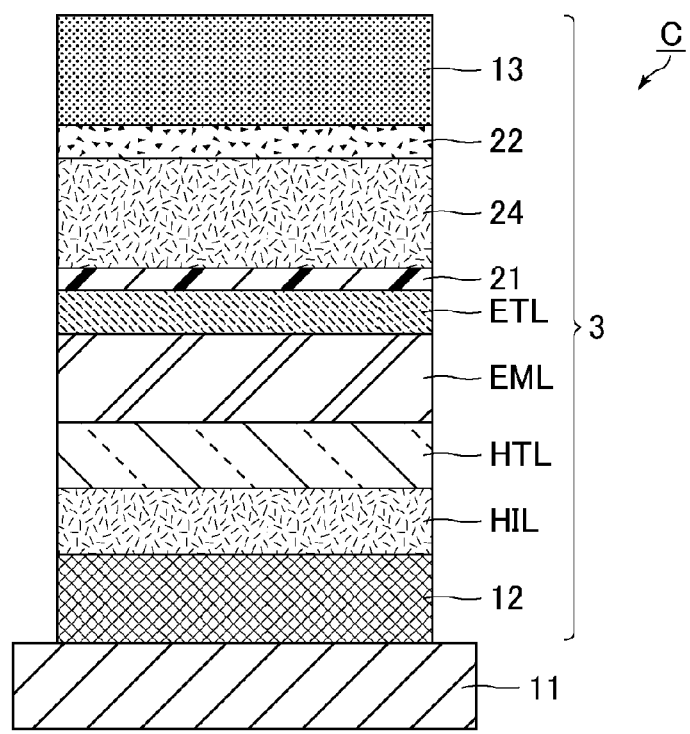
FIG. 4 is a schematic cross-sectional view of a modified example of the organic EL panel of Example 2.

One modified example of Example 2 is a structure having the mixture layer between the first metal layer and the p-type oxide layer. FIG. 4 is a schematic cross-sectional view of a modified example of the organic EL panel of Example 2. In an organic EL panel C illustrated in FIG. 4, an organic EL element 3 provided on the substrate 11 includes, in the order from the substrate 11 side, the anode 12, the hole injection layer HIL, the hole transport layer HTL, the light-emitting layer EML, the electron transport layer ETL, the first metal layer 21, the mixture layer 24, the p-type oxide layer 22, and the transparent cathode 13.

Another modified example of Example 2 is a structure having the mixture layer between the electron transport layer and the first metal layer. In this modified example, the organic EL element provided on the substrate 11 includes, in the order from the substrate 11 side, the anode 12, the hole injection layer HIL, the hole transport layer HTL, the light-emitting layer EML, the electron transport layer ETL, the mixture layer 24, the first metal layer 21, the p-type oxide layer 22, and the transparent cathode 13.

Example 3

Example 3 relates to a structure including a multiphoton-type organic EL element having two light emitting units. An organic EL panel of Example 3 has the same configuration as of Example 1 except that a first light emitting unit EMU1 is additionally provided between the hole injection layer HIL and the anode 12 in the organic EL element. The light emitting unit (EMU) is constituted by a laminate of the hole injection layer HIL, the hole transport layer HTL, the light-emitting layer EML, the electron transport layer ETL, the first metal layer 21, and the p-type oxide layer 22. The first light emitting unit EMU1 has the same structure and composition as the light emitting unit included in Example 1.

Figure 5:
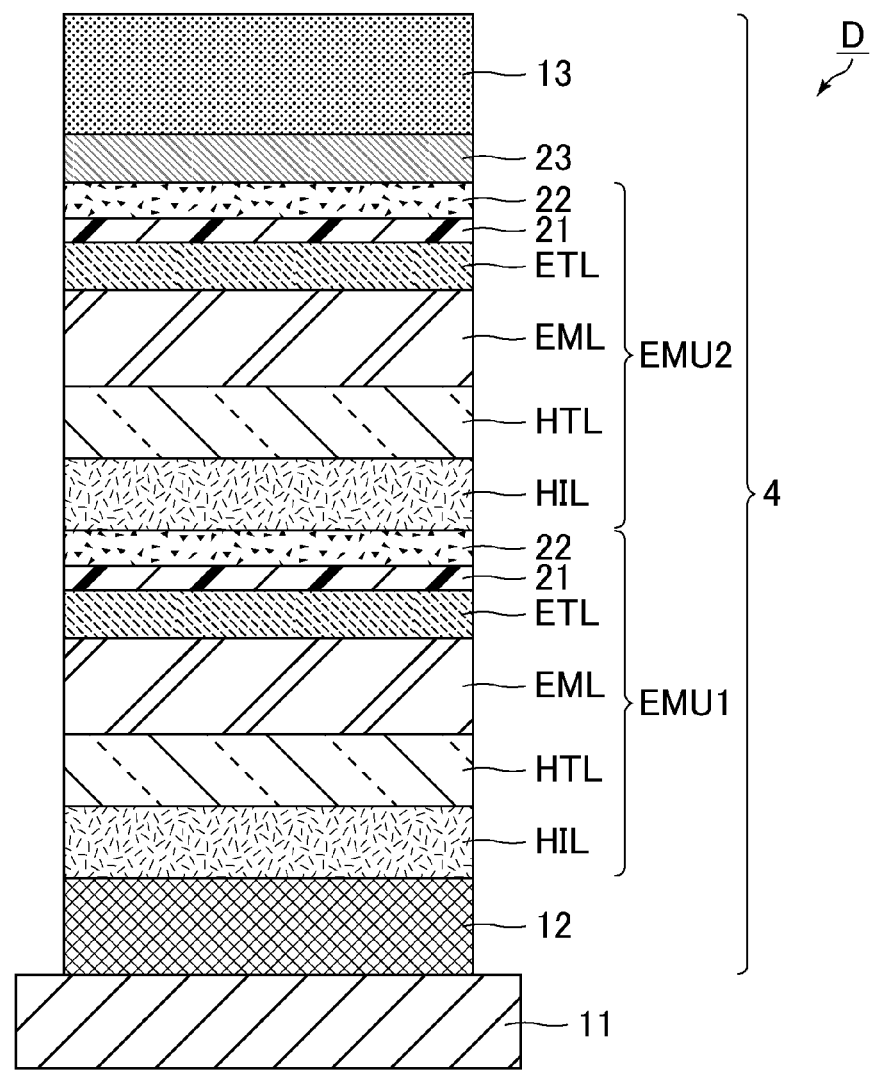
FIG. 5 is a schematic cross-sectional view of an organic EL panel of Example 3.

FIG. 5 is a schematic cross-sectional view of an organic EL panel of Example 3. In an organic EL panel D illustrated in FIG. 5, an organic EL element 4 provided on the substrate 11 includes, in the order from the substrate 11 side, the anode 12, the hole injection layer HIL, the hole transport layer HTL, the light-emitting layer EML (second light-emitting layer), the electron transport layer ETL (second electron transport layer), the first metal layer 21 (third metal layer) and the p-type oxide layer 22 (second p-type oxide layer), the hole injection layer HIL, the hole transport layer HTL, the light-emitting layer EML, the electron transport layer ETL, the first metal layer 21 and the p-type oxide layer 22, the second metal (Al) layer 23, and the transparent cathode (ITO) 13. The laminate of the hole injection layer HIL, the hole transport layer HTL, the light-emitting layer EML, the electron transport layer ETL, the first metal layer 21, and the p-type oxide layer 22 on the anode 12 side corresponds to the first light emitting unit EMU1, and the laminate of the hole injection layer HIL, the hole transport layer HTL, the light-emitting layer EML, the electron transport layer ETL, the first metal layer 21, and the p-type oxide layer 22 on the transparent cathode 13 side corresponds to a second light emitting unit EMU2.

The first metal layer 21 and the p-type oxide layer 22 ($Li/MoO_3$) in each of the first and second light emitting units EMU1 and EMU2 serve as charge generating layers (CGL) between the light emitting units. $MoO_3$ is a material that can emit, as a charge generating layer, holes and electrons to the adjacent layers. Combination of the $MoO_3$ layer with the Li layer enables injection of electrons and holes to the light emitting units with hardly any barrier.

The first light emitting unit EMU1 used a blue luminescent material as a dopant and the second light emitting unit EMU2 used a red luminescent material as a dopant.

The present example has a tandem structure achieved by adding the first light emitting unit EMU1 to the structure of Example 1. Still, a tandem structure may be achieved by adding the first light emitting unit EMU1 to the structure of Example 2.

Comparative Example 1

Comparative Example 1 is the same as Example 1 except that no second metal layer is provided between the p-type oxide layer and the transparent cathode. In other words, Comparative Example 1 is the same as Example 2 except that no mixture layer is provided between the p-type oxide layer and the transparent cathode.

Figure 6:
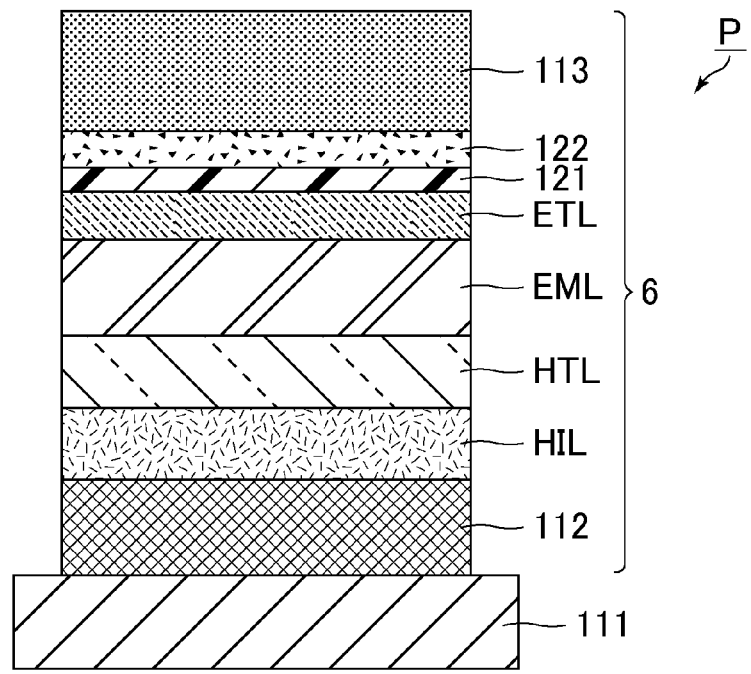
FIG. 6 is a schematic cross-sectional view of an organic EL panel of Comparative Example 1.

FIG. 6 is a schematic cross-sectional view of an organic EL panel of Comparative Example 1. In an organic EL panel P illustrated in FIG. 6, an organic EL element 6 provided on a substrate 111 includes, in the order from the substrate 111 side, an anode 112, the hole injection layer HIL, the hole transport layer HTL, the light-emitting layer EML, the electron transport layer ETL, a first metal (Li) layer 121, a p-type oxide ($MoO_3$) layer 122, and a transparent cathode 113.

Comparative Example 2

Comparative Example 2 is the same as Comparative Example 1 except that in the organic EL element, the first metal layer 21 is changed from the Li layer to a 0.5-nm-thick lithium fluoride (LiF) layer and the p-type oxide layer 22 is changed to a 1-nm-thick MgAg alloy layer. In order to emit light from the transparent cathode side, the MgAg alloy layer needs to be thin. Thus, it was 1 nm thick.

Figure 7:
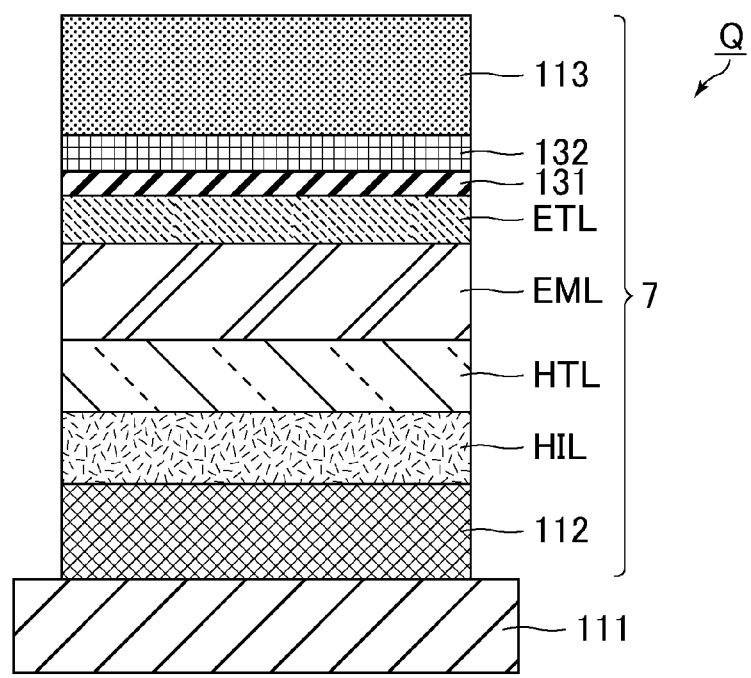
FIG. 7 is a schematic cross-sectional view of an organic EL panel of Comparative Example 2.
Figure 8:
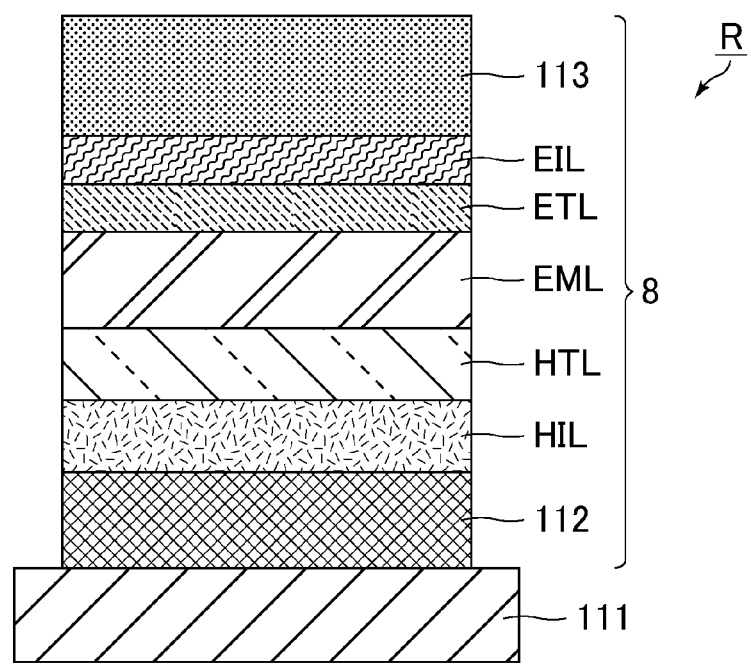
FIG. 8 is a schematic cross-sectional view of a conventionally usual top-emission-structured organic EL panel.

FIG. 7 is a schematic cross-sectional view of an organic EL panel of Comparative Example 2. In an organic EL panel Q illustrated in FIG. 7, an organic EL element 7 provided on the substrate 111 includes, in the order from the substrate 111 side, the anode 112, the hole injection layer HIL, the hole transport layer HTL, the light-emitting layer EML, the electron transport layer ETL, a LiF layer 131, a MgAg alloy layer 132, and the transparent cathode 113.

[Evaluation Test 1]

For the respective organic EL panels A, B, C, P, and Q of Examples 1 to 3 and Comparative Examples 1 and 2, the driving voltage at a luminance of 1000 cd/m$^2$ was measured. The driving voltage was measured using an FPD module measurement device (MD series, Otsuka Electronics Co., Ltd.) equipped with a luminance colorimeter (BM-5A, Topcon Technohouse Corp.) used as a detector.

The measurement shows that the driving voltages of the organic EL panels A and B of Examples 1 and 2 were 3.0 V and the driving voltage of the organic EL panel P of Comparative Example 1 was 3.2 V. The organic EL panel Q of Comparative Example 2 emitted hardly any light.

Therefore, the driving voltages in Examples 1 and 2 were more decreased than in Comparative Example 1. The driving voltages in Examples 1 and 2 are on the same level as that of a bottom emission (BE) structure having the same configuration, and thus an increase in the voltage due to the top emission (TE) structure is prevented. This is presumably because the second metal (Al) layer 23 of Example 1 and the mixture (α-NPD+$MoO_3$) layer 24 of Example 2 serve as protecting layers and almost prevent damages during formation of the ITO films. The reason why the organic EL panel of Comparative Example 2 emitted hardly any light is presumably because the thin MgAg alloy layer 132 was damaged during formation of the ITO film, and this affected the LiF layer 131, the electron transport layer ETL, and the organic layers below the electron transport layer ETL.

It is confirmed that the modified examples of Examples 1 and 2 can achieve the driving voltages equal to those in Examples 1 and 2.

[Evaluation Test 2]

For the respective organic EL element C, first light emitting unit EMU1, and second light emitting unit EMU2 of Example 3, the driving voltage with a current of 2 mA was measured. The measurement shows that in Example 3, the driving voltage of the organic EL element C was 6.6 V, the driving voltage of the first light emitting unit EMU1 was 3.3 V, and the driving voltage of the second light emitting unit EMU2 was 3.2 V. Therefore, it is confirmed that the tandem structure caused hardly any voltage loss.

Remarks

The following gives examples of preferred embodiments of the organic EL panel according to the present invention. The examples may be employed in any appropriate combination as long as the combination is not beyond the spirit of the present invention.

The absolute value of the work function (WF) of the first metal layer is preferably smaller than the absolute value of the lowest unoccupied molecular orbital (LUMO) energy of the electron transport layer. This enables transport of electrons from the first metal layer to the electron transport layer without any barrier.

The second metal layer may be provided between the p-type oxide layer and the transparent cathode. This enables sufficient prevention of damages on the electron transport layer and the layers formed before the electron transport layer during formation of the transparent cathode.

The mixture layer may be provided between the p-type oxide layer and the transparent cathode. This also enables sufficient prevention of damages on the layers formed before the electron transport layer during formation of the transparent cathode.

The organic electroluminescent element may include, in the order from the substrate side, a second light-emitting layer, a second electron transport layer, a third metal layer, and a second p-type oxide layer, between the anode and the light-emitting layer. This provides a multiphoton-type organic EL element having two or more light emitting units. $MoO_3$ can emit, as a charge generating layer, holes and electrons to the adjacent layers. In combination with Li, $MoO_3$ can inject electrons and holes to the light emitting units with hardly any barrier.

The absolute value of the work function (WF) of the third metal layer is preferably smaller than the absolute value of the lowest unoccupied molecular orbital (LUMO) energy of the second electron transport layer. This enables transport of electrons from the third metal layer to the second electron transport layer without any barrier.

REFERENCE SIGNS LIST 11, 111: substrate
12, 112: anode
13, 113: transparent cathode
21: first metal layer
22: p-type oxide layer
23: second metal layer
24: mixture layer
1, 2, 3, 4, 6, 7, 8: organic electroluminescent element
A, B, C, D, P, Q, R: organic electroluminescent panel
EIL: electron injection layer
ETL: electron transport layer
HIL: hole injection layer
EML: light-emitting layer
HTL: hole transport layer

The invention claimed is:

1. An organic electroluminescent panel comprising:
   a substrate; and
   an organic electroluminescent element provided on the substrate,
   the organic electroluminescent element being a top emission element that includes, in the order from the substrate side:
   an anode;
   a light-emitting layer;
   an electron transport layer;
   a first metal layer;
   a p-type oxide layer; and
   a transparent cathode, wherein
   the top emission element being configured to emit light from the transparent cathode side,
   the light-emitting layer and the electron transport layer each being formed from an organic material,
   a mixture layer of a p-type oxide and a hole transport material being provided between the electron transport layer and the transparent cathode, and
   the mixture layer is provided between the p-type oxide layer and the transparent cathode.

2. The organic electroluminescent panel according to claim 1,
   wherein the absolute value of a work function of the first metal layer is smaller than the absolute value of a lowest unoccupied molecular orbital energy of the electron transport layer.

3. The organic electroluminescent panel according to claim 1,
   wherein the second metal layer is provided between the p-type oxide layer and the transparent cathode.

4. The organic electroluminescent panel according to claim 1,
   wherein the organic electroluminescent element comprises, in the order from the substrate side, a second light-emitting layer, a second electron transport layer, a second metal layer, and a second p-type oxide layer, between the anode and the light-emitting layer.

5. The organic electroluminescent panel according to claim 4,
   wherein the absolute value of a work function of the second metal layer is smaller than the absolute value of a lowest unoccupied molecular orbital energy of the second electron transport layer.

6. The organic electroluminescent panel according to claim 1,
   wherein the organic electroluminescent element includes a hole injection layer between the anode and the light-emitting layer, and the mixture layer is made of the same material as a material of the hole injection layer.

7. The organic electroluminescent panel according to claim 1,
   wherein the mixture layer is a p-doped layer formed by co-deposition of an organic hole injection material and the p-type oxide.

8. The organic electroluminescent panel according to claim 7,
   wherein the organic hole injection material is α-NPD.

9. The organic electroluminescent panel according to claim 7,
   wherein the p-type oxide is molybdenum trioxide.

10. The organic electroluminescent panel according to claim 1,
   wherein the mixture layer is provided between the first metal layer and the p-type oxide layer.

11. The organic electroluminescent panel according to claim 1,
   wherein the mixture layer is provided between the electron transport layer and the first metal layer.

12. The organic electroluminescent panel according to claim 7,
   wherein an amount of the p-type oxide in the mixture layer is 10 to 50% by weight.

13. The organic electroluminescent panel according to claim 7,
   wherein an amount of the p-type oxide in the mixture layer is 15 to 25% by weight.

* * * * *